(12) United States Patent
Doris et al.

(10) Patent No.: US 8,564,040 B1
(45) Date of Patent: Oct. 22, 2013

(54) INVERSION MODE VARACTOR

(75) Inventors: Bruce B. Doris, Brewster, NY (US);
Kangguo Cheng, Guilderland, NY (US);
Ali Khakifirooz, Slingerlands, NY (US);
Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/570,360

(22) Filed: Aug. 9, 2012

Related U.S. Application Data

(63) Continuation of application No. 13/570,313, filed on Aug. 9, 2012, which is a continuation of application No. 13/546,150, filed on Jul. 11, 2012.

(51) Int. Cl.
*H01L 27/108* (2006.01)

(52) U.S. Cl.
USPC ............... 257/313; 257/312; 257/E21.176

(58) Field of Classification Search
USPC .......... 257/313, 596, 611, E21.176, E21.177, 257/E21.191, E21.4, E21.457, E21.532
See application file for complete search history.

(56) References Cited

U.S. PATENT DOCUMENTS

| | | | |
|---|---|---|---|
| 6,172,378 B1 | 1/2001 | Hull et al. ........................ 257/14 |
| 6,803,269 B2 | 10/2004 | Coolbaugh et al. ............ 438/224 |
| 7,169,679 B2 | 1/2007 | Yue et al. ....................... 438/379 |
| 7,714,412 B2 | 5/2010 | Coolbaugh et al. ............ 257/595 |
| 2009/0057742 A1 | 3/2009 | Lee et al. ....................... 257/312 |
| 2009/0057746 A1 | 3/2009 | Sugll et al. .................... 257/315 |
| 2010/0093148 A1 | 4/2010 | Dahlstrom et al. ............ 438/379 |
| 2010/0230753 A1 | 9/2010 | Johnson et al. ................ 257/347 |
| 2011/0062555 A1 | 3/2011 | Fried et al. ..................... 257/595 |

OTHER PUBLICATIONS

"Characterization, modeling, and optimization of FinFET MOS varactors", M. Dehan et al., IEEE 2007, pp. 28-31.
"Fully Depleted Extremely Thin SOI for Mainstream 20nm Low-Power Technology and Beyond", A. Khakifirooz, et al., ISSCC 2010/ Session 7/Designing in Emerging Technologies/7.10, IEEE International Solid-State Circuits Conference, 2010, pp. 152-153.
"Extremely Thin SOI (ETSOI) CMOS with Record Low Variability for Low Power System-on-Chip Applications", K. Cheng, et al., 4 pgs. Dec. 2009.
"Extremely Thin SOI (ETSOI) Technology: Past, Present, and Future", K. Cheng, et al., IEEE 2010, 4 pgs.
"Analytical extraction of small and large signal models for FinFET varactors", Giovanni Crupi et al., ScienceDirect—Solid State Electronics 52, 2008, pp. 704-710.
"Principles of Semiconductor Devices", B. Van Zeghbroeck, 2011, 4 pgs.

*Primary Examiner* — Cheung Lee
(74) *Attorney, Agent, or Firm* — Harrington & Smith

(57) ABSTRACT

In one exemplary embodiment of the invention, a method includes: providing an inversion mode varactor having a substrate, a backgate layer overlying the substrate, an insulating layer overlying the backgate layer, a semiconductor layer overlying the insulating layer and at least one metal-oxide semiconductor field effect transistor (MOSFET) device disposed upon the semiconductor layer, where the semiconductor layer includes a source region and a drain region, where the at least one MOSFET device includes a gate stack defining a channel between the source region and the drain region, where the gate stack has a gate dielectric layer overlying the semiconductor layer and a conductive layer overlying the gate dielectric layer; and applying a bias voltage to the backgate layer to form an inversion region in the semiconductor layer at an interface between the semiconductor layer and the insulating layer.

17 Claims, 7 Drawing Sheets

INVERSION MODE VARACTOR

CROSS REFERENCE TO RELATED APPLICATIONS

This is a continuation patent application of U.S. patent application Ser. No. 13/570,313, filed Aug. 9, 2012, which is a continuation of U.S. patent application Ser. No. 13/546,150, filed Jul. 11, 2012, both of which are hereby incorporated by reference in their entireties.

TECHNICAL FIELD

The exemplary embodiments of this invention relate generally to semiconductor structures and, more specifically, relate to an inversion mode varactor.

BACKGROUND

This section endeavors to supply a context or background for the various exemplary embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

Variable reactors (varactors) are electronic devices (e.g., solid-state diodes) that have a capacitance that is controlled by a suitable voltage or current bias. For example, as a reverse voltage is applied to a PN junction of a varactor diode, electrons in the n-region are attracted to the cathode while holes in the p-region are attracted to the anode. This results in the formation of a depletion region between the anode and cathode that behaves as the dielectric of the device. As the applied reverse voltage increases, the depletion region (i.e., dielectric) widens, while the capacitance across the PN junction decreases since capacitance is inversely proportional to dielectric thickness. Therefore, by varying the reverse voltage across a PN junction of a varactor diode, the junction capacitance can be varied.

The variability of the capacitance in a varactor may be advantageously employed in various electronic circuits to provide useful functions, for example, in amplifiers, oscillators, and frequency synthesizers. As a non-limiting example, varactors may be used to construct voltage-controlled oscillators (VCOs), which can generate a tunable stable frequency (e.g., controllable by an applied current or voltage) without employing a circuit with multiple oscillators. A VCO is a versatile basic building block for constructing transceiver circuitry, phase locked loop (PLL) circuitry and other wireless communication circuitry. In such instances, VCOs may be used when a variable frequency is required or when a signal is to be synchronized to a reference signal, as non-limiting examples. Varactors are also used in, among other things, frequency multipliers, harmonic generators, and modulation/demodulation operations.

In general, varactor designs must maximize a number of properties. One such property is "tunability," which is the ratio between the highest and lowest capacitive values ($C_{max}/C_{min}$) over the range of applied voltages for the circuit. Another property is "linearity." There are two definitions for "linearity": (i) $1/\sqrt{C}$; and (ii)

$$\frac{d(\ln C)}{dV},$$

where C is the voltage-dependent varactor capacitance. In the first case (i) it is desired that $1/\sqrt{C}$ be a straight line and in the second case (ii) that $$\frac{d(\ln C)}{dV}$$

be a constant, both as V varies. Yet another property is "Q," or quality factor, which is a function of the series resistance of the diode and the capacitive value of the varactor at the higher frequency ranges of the circuit.

BRIEF SUMMARY

In one exemplary embodiment of the invention, a method comprising: providing an inversion mode varactor comprising a substrate, a backgate layer overlying the substrate, an insulating layer overlying the backgate layer, a semiconductor layer overlying the insulating layer and at least one metal-oxide semiconductor field effect transistor (MOSFET) device disposed upon the semiconductor layer, where the semiconductor layer comprises a source region and a drain region, where the at least one MOSFET device comprises a gate stack defining a channel between the source region and the drain region, where the gate stack comprises a gate dielectric layer overlying the semiconductor layer and a conductive layer overlying the gate dielectric layer; and applying a bias voltage to the backgate layer to form an inversion region in the semiconductor layer at an interface between the semiconductor layer and the insulating layer.

In another exemplary embodiment of the invention, an inversion mode varactor structure comprising: a substrate; a backgate layer overlying the substrate; an insulating layer overlying the backgate layer; a semiconductor layer overlying the insulating layer, where the semiconductor layer comprises a source region and a drain region; and at least one metal-oxide semiconductor field effect transistor (MOSFET) device disposed upon the semiconductor layer, where the at least one MOSFET device comprises a gate stack defining a channel between the source region and the drain region, where the gate stack comprises a gate dielectric layer overlying the semiconductor layer and a conductive layer overlying the gate dielectric layer, where a bias voltage is applied to the backgate layer via a contact, where the applied bias voltage forms an inversion region in the semiconductor layer at an interface between the semiconductor layer and the insulating layer.

In a further exemplary embodiment of the invention, an inversion mode varactor structure comprising: a substrate; a backgate layer overlying the substrate; an insulating layer overlying the backgate layer; a semiconductor layer overlying the insulating layer, where the semiconductor layer comprises a source region and a drain region; and at least one metal-oxide semiconductor field effect transistor (MOSFET) device disposed upon the semiconductor layer, where the at least one MOSFET device comprises a gate stack defining a channel between the source region and the drain region, where the gate stack comprises a gate dielectric layer overlying the semiconductor layer and a conductive layer overlying the gate dielectric layer, where the backgate layer is doped such that an inversion region is formed in the semiconductor layer at an interface between the semiconductor layer and the insulating layer.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

Figure 1:
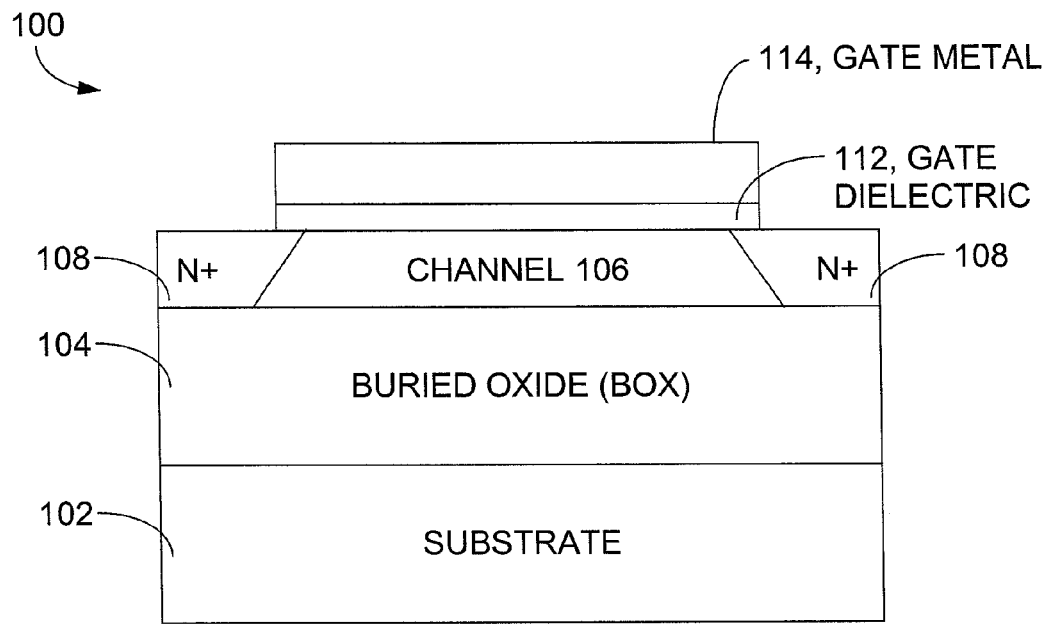
FIG. 1 shows a conventional inversion mode varactor in an n-type FDSOI.

Varactors with a high quality factor are needed for analog applications. Metal-oxide semiconductor (MOS) varactors (e.g., varactors comprising one or more metal-oxide semiconductor field effect transistors, MOSFETs) that operate between accumulation and depletion are used in bulk complementary metal-oxide semiconductor (CMOS) devices where, for example, an N-well is used with N+ doped source/drains. However, accumulation mode varactors do not operate well in fully-depleted silicon-on-insulator (FDSOI) structures. For example, with an N-well varactor when a large negative gate voltage is applied the device is in accumulation and has low series resistance. However, as the gate voltage is changed to more positive values, the device gradually goes to depletion, the capacitance decreases and at the same time the series resistance increases. Note that in a bulk accumulation mode varactor there is always enough charge under the depletion region to keep the series resistance low.

An alternative approach is to use inversion mode varactors. The channel can be kept undoped to maximize charge mobility and keep resistance low. For example, as the gate voltage is increased from about 0V to positive values the device goes from depletion to inversion and capacitance increases from nearly zero to $C_{inv}$. However, in weak inversion the amount of the inversion charge (C) is very small and, hence, series resistance (R) is very high, limiting the quality factor $$\left(Q = \frac{1}{\omega RC}\right).$$

Note that $\omega = 2\pi f$, where f is the operation frequency. To overcome this limitation, the gate length ($L_g$) of the inversion mode varactors is kept small. With a short gate length, when the varactor is in the depletion, the capacitance is dominated by the parasitic capacitance and channel resistance is not important (i.e., not significant). On the other hand, when the varactor is in strong inversion, there is enough inversion charge to keep channel resistance small. However, in the transition region (i.e., in weak inversion), the resistance is still high while capacitance is gradually increasing. Since it is desirable to have a low series resistance leading to a higher quality factor, there is a need for an inversion mode varactor with a high quality factor in the transition regime (i.e., weak inversion).

The exemplary embodiments of the invention utilize a backgate and/or back interface located in the semiconductor layer close to the buried oxide (BOX) interface in a fully-depleted silicon-on-insulator (FDSOI) inversion mode varactor. The voltage on the backgate is selectively controlled or applied and, in some exemplary embodiments, may be variable during operation. A positive voltage may be used for an n-type varactor whereas a negative voltage may be used for a p-type varactor. When the front gate voltage is near zero, there will be some inversion charge at the back interface of the semiconductor. As the gate voltage increases, the charge centroid will move from the back interface to the front interface and the capacitance will increase. Since there is always some inversion charge in the channel, series resistance is kept small.

It should be noted that for transistors generally it is not desirable to form inversion (an inversion layer, an inversion region) at the back interface since this can lead to an increase (e.g., a significant increase) in leakage. However, the exemplary embodiments of the invention utilize the formation of such an inversion layer at the backside of the semiconductor of an inversion mode varactor to lower series resistance and improve the quality factor. Thus, it has been discovered that a technique that may be undesirable for one type of component (e.g., a transistor) is actually useful and, in fact, desirable for a different type of component (e.g., a varactor).

For a MOSFET with a positive gate voltage, inversion occurs when there exists a negatively-charged inversion layer at the oxide-semiconductor interface in addition to the depletion layer. The inversion layer is due to the minority carriers that are attracted to the interface by the positive gate voltage. One of ordinary skill in the art will appreciate the formation, presence and usage of such an inversion layer within the context of an inversion mode varactor (e.g., n-type or p-type varactor).

FIG. 1 shows a conventional inversion mode varactor 100 in an n-type FDSOI. As can be seen in FIG. 1, the varactor 100 includes a substrate 102 with a buried oxide (BOX) 104 overlying the substrate 102. Overlying the BOX 104 is a channel 106 with N+ doped regions 108 for the source/drain (S/D). Overlying the channel 106 is at least a gate dielectric 112 and a gate metal 114. Note that raised S/D structures optionally may be used in order to lower parasitic resistance.

Figure 2:
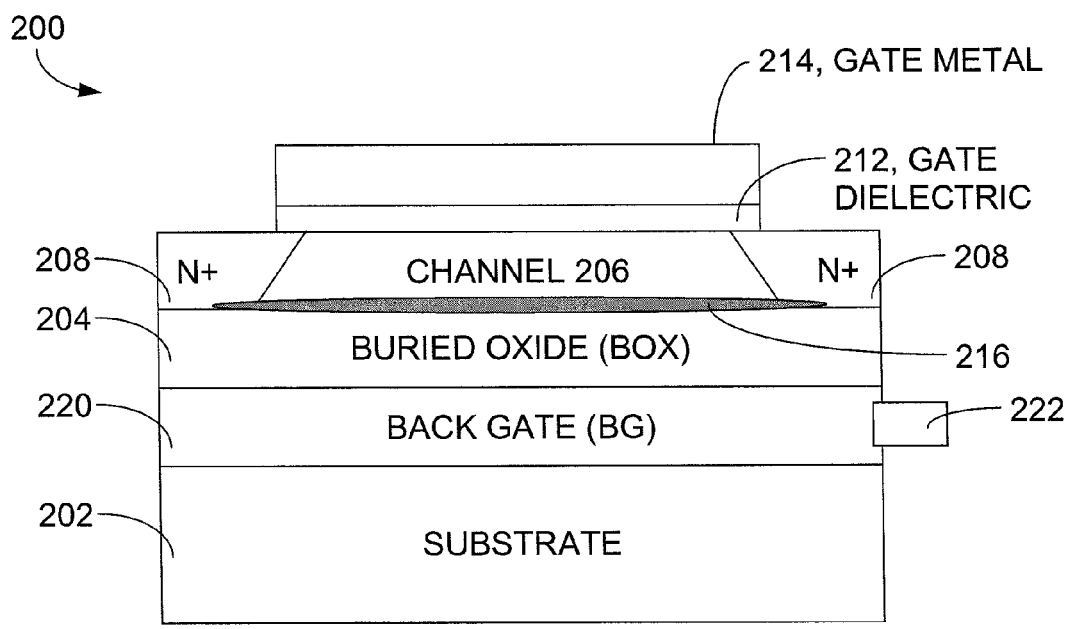
FIG. 2 shows one exemplary embodiment of the invention, namely an exemplary design for an n-type inversion mode varactor.

FIG. 2 shows one exemplary embodiment of the invention, namely an exemplary design for an n-type inversion mode varactor 200 (e.g., in a FDSOI). Unlike the conventional varactor 100 of FIG. 1, the exemplary varactor 200 in FIG. 2 has a backgate (BG) 220 disposed between the substrate 202 and the buried oxide (BOX) 204 (e.g., BOX layer, layer comprised of BOX, layer comprised of an oxide). The BG 220 is connected to a positive voltage (e.g., because the exemplary varactor 200 is an n-type varactor) so that the semiconductor 206 close to the BOX interface 204 is in inversion. In other exemplary embodiments, the BG 220 may be connected to a negative voltage (e.g., for a p-type varactor).

In some exemplary embodiments, a contact 222 (e.g., at least one contact) is used to connect the BG 220 to the voltage (e.g., the voltage source). The contact 222 may be coupled (directly or indirectly) to a voltage source in order to enable the voltage source to apply the desired voltage (positive or negative, depending on the composition of the varactor) to the BG 220. In some exemplary embodiments, the contact may be shared by several devices, modules and/or components (e.g., transistors, varactors), for example, via a bus. Note that some exemplary embodiments of the invention will not require the presence or usage of a contact. In some exemplary embodiments, and by way of a non-limiting example, if an N+ backgate is used for an N-type varactor, it is possible to have some inversion charge at the back interface even without a bias. In such a case, a contact may not be needed.

Note that the voltage at the backgate is high enough (i.e., for a positive voltage being applied for an n-type varactor) to form an inversion region 216 at the back interface of the channel (i.e., at the interface with the BOX 204). As a non-limiting example, usually a voltage in excess of 1 V is used for a typical BOX thickness (e.g., 5-50 nm).

As non-limiting examples, the BG 220 may comprise a heavily doped region or portion of the substrate 202 (e.g., the substrate 202 may comprise the BG 220) or a conductive layer made in the substrate (e.g., a layer comprised of a metal, a layer comprised of a doped semiconductor, a layer comprised of doped polycrystalline silicon). In some exemplary embodiments, an n-type region for the BG 220 is used for an n-type varactor. As a non-limiting example, if a doped region is used for the BG 220, the doping concentration may be more than about $1e^{18}$ cm$^{-3}$ or more than about $1e^{19}$ cm$^{-3}$. As a non-limiting example, the thickness of the BG 220 may vary from about 20 nm to about 200 nm. As a non-limiting example, the thickness of the BOX 204 may vary from about 5 nm to about 50 nm, though any suitable thickness may be used (e.g., depending on the device parameters and desired properties). The BG 220 also may be referred to as a back interface, P-well or N-well (e.g., depending on the doping of the BG 220).

Note that overlying the BOX 204 is a channel 206 (e.g., an undoped channel) with doped regions 208 (e.g., N+ doped for a n-type varactor, P+ doped for a p-type varactor) for the source/drain (S/D). Overlying the channel 206 are at least a layer comprised of a dielectric 212 (e.g., silicon oxide, silicon nitride, silicon oxynitride, a high-k dielectric) and a "metal" layer 214 comprised of a metal and/or a semiconductor material (e.g., polysilicon and/or a metal). In some exemplary embodiments, the layer comprised of a dielectric 212 (e.g., a gate dielectric, a gate dielectric layer, a high-k dielectric layer) and the metal layer 214 (e.g., a conductive layer, a gate metal, a gate metal layer) may collectively be referred to as a gate stack. Such a gate stack may include one or more additional layers or components, such as a layer of polysilicon and/or a cap layer (e.g., comprised of nitride), as non-limiting examples. Note that raised S/D structures optionally may be used in order to lower parasitic resistance. Furthermore, the exemplary varactor 200 may include one or more additional components and/or elements, such as: one or more spacers, one or more additional semiconductor structures (e.g., additional varactors, additional FETs, additional MOSFETs) and/or one or more isolation elements (e.g., shallow trench isolations STIs), as non-limiting examples.

Figure 3:
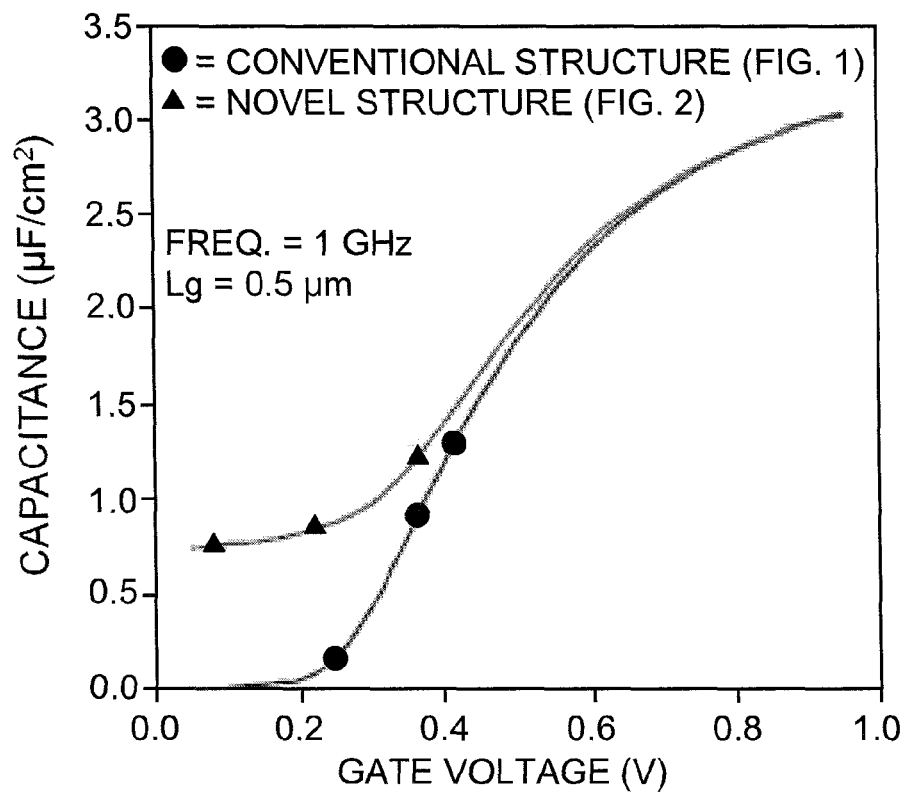
FIGS. 3 and 4 show example data comparing the performance of a conventional inversion mode varactor (FIG. 1) with an exemplary novel inversion mode varactor structure (FIG. 2)
Figure 4:
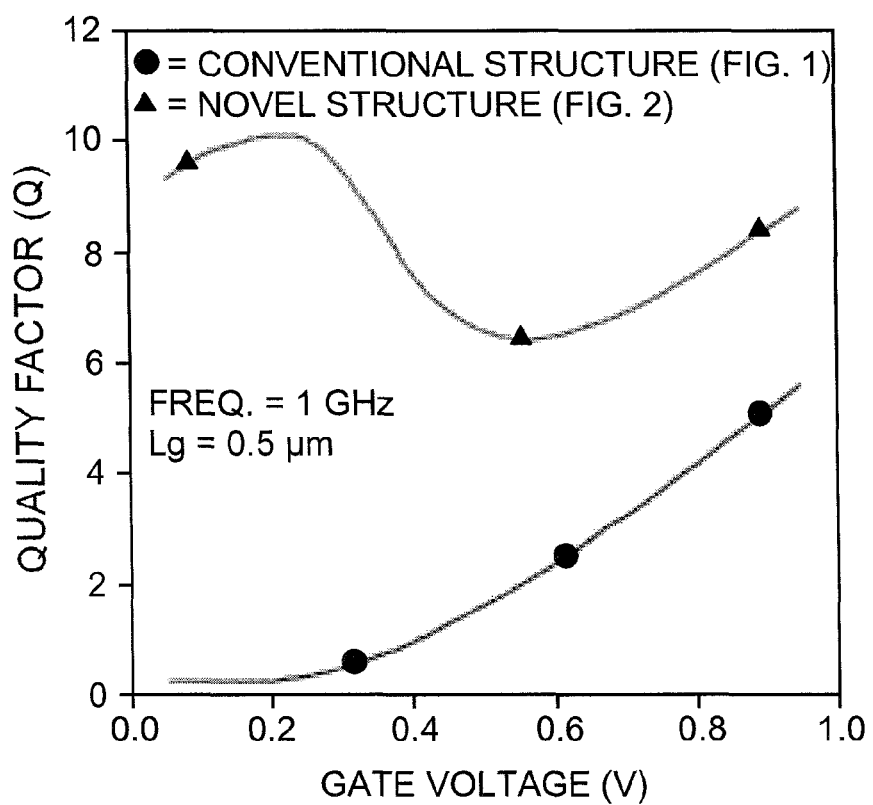

FIGS. 3 and 4 show example data comparing the performance of a conventional inversion mode varactor (FIG. 1) with an exemplary novel inversion mode varactor structure (FIG. 2). Note that the symbols shown in FIGS. 3 and 4 (i.e., the circles and triangles) are indicia used to distinguish between the data. These symbols are not data points. FIG. 3 shows a graph of capacitance ($\mu$F/cm$^2$) vs. gate voltage (V) for the two varactors. FIG. 4 shows a graph of quality (Q) vs. gate voltage (V) for these two varactors. In the data for FIGS. 3 and 4, the frequency is 1 GHz and the gate length ($L_g$) is 0.5 $\mu$m.

As shown in FIG. 3, the capacitance is modulated between almost zero (more precisely the parasitic capacitance, $C_{para}$) and the inversion capacitance, $C_{inv}$ (more precisely $C_{inv}$+ $C_{para}$). Thus, a large $C_{max}/C_{min}$ ratio is expected. However, for a conventional varactor in weak inversion the channel resistance is very high and this significantly limits the quality factor, as is apparent in FIG. 4.

In accordance with the exemplary embodiments of the invention, a backbias (i.e., applied voltage) keeps the back interface in inversion. With a small front gate voltage, the inversion charge centroid is near the back interface and, thus, the capacitance is small. As the gate voltage is increased, the inversion charge increases and the charge centroid shifts toward the front interface. Thus, the capacitance gradually increased to $C_{inv}$ (more precisely $C_{inv}$+$C_{para}$). As shown in FIG. 3, the $C_{max}/C_{min}$ ratio may be smaller in at least some exemplary embodiments of the invention (i.e., as compared with the conventional inversion mode varactor), but the quality factor (Q) is significantly larger.

Note that at least some of the exemplary embodiments of the invention do not use a body-contact to modulate the capacitance. That is, the backgate is disposed below the BOX. In addition, at least some of the exemplary embodiments of the invention are suitable for use with FDSOI (e.g., a FDSOI with an ultra-thin BOX). Further, at least some of the exemplary embodiments of the invention do not use and/or require epitaxy silicon layers under the gate electrode. In addition, it is noted that techniques associated with partially-depleted silicon-on-insulator (PDSOI) may not be usable and/or suitable for FDSOI. As such, at least some of the exemplary embodiments of the invention provide improvements over prior art structures by enabling usage with FDSOI.

Referring to FIG. 2, an exemplary semiconductor structure (e.g., inversion mode varactor) according to exemplary embodiments of the invention comprises a semiconductor substrate including a bottom substrate layer 202, a buried insulator layer 204, and a top semiconductor layer (e.g., wherein the channel 206 and source/drain 208 are formed). The bottom substrate layer 202 may comprise a semiconductor material, a metallic material or a dielectric material, as non-limiting examples. For example, the bottom substrate layer 202 may comprise silicon. The thickness of the bottom substrate layer 202 is typically from about 50 microns to about 1,200 microns, and more typically from about 500 microns to about 1,000 microns, as non-limiting examples. The bottom substrate layer 202 provides mechanical support for the layers and structures overlying it. As non-limiting examples, the buried insulator layer 204 may comprise a dielectric material such as silicon oxide, silicon nitride, silicon oxynitride, and/or sapphire. Typically, the buried insulator layer 204 comprises silicon oxide, for example. The thickness of the buried insulator layer 204 may be from about 50 nm to about 500 nm, although lesser and greater thicknesses are also contemplated herein. One non-limiting example of a semiconductor material for the top semiconductor layer is silicon. The thickness of the top semiconductor layer may be from about 3 nm to about 30 nm, and typically from about 5 nm to about 20 nm, although lesser and greater thicknesses are also contemplated herein.

As previously noted, a gate dielectric 212 overlies the channel 206 and/or source/drain 208. As a non-limiting example, the gate dielectric layer 212 may comprise a high dielectric constant (high-k) material. As a further non-limiting example, the high-k dielectric material may comprise a dielectric metal oxide having a dielectric constant that is greater than the dielectric constant of silicon oxide (greater than 3.9). As a further non-limiting example, the high-k dielectric material may have a dielectric constant greater than 8.0. Non-limiting exemplary high-k dielectric materials include: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, one or more silicates thereof, and one or more alloys thereof. Each value of x is independently from about 0.5 to about 3 and each value of y is independently from 0 to about 2. The high-k dielectric material layer may be formed by methods well known in the art including, for example, a chemical vapor deposition (CVD), an atomic layer deposition (PVD), molecular beam epitaxy (MBE), pulsed laser deposition (PLD), and/or liquid source misted chemical deposition (LSMCD). In case the gate dielectric layer 212 comprises a high-k dielectric material, the thickness of the gate dielectric layer 212 may be from about 2 nm to about 10 nm, although lesser and greater thicknesses are also contemplated herein also.

After formation of the gate dielectric layer 212, a gate metal layer 214 (e.g., a gate electrode layer) is formed on the gate dielectric layer 212. As a non-limiting example, the gate metal layer 214 may be a semiconductor layer having a polycrystalline, microcrystalline, or amorphous structure. As a further non-limiting example, the semiconductor layer may include a semiconductor material such as silicon, a silicon containing alloy, a germanium containing alloy, a III-V compound semiconductor, and/or a II-IV semiconductor. As a further non-limiting example, the semiconductor layer may be doped with at least one electrical dopant such as boron, gallium, indium, phosphorus, arsenic, antimony, and/or a combination thereof. As non-limiting examples, the semiconductor layer may be formed by chemical vapor deposition (CVD) such as rapid thermal chemical vapor deposition (RTCVD), low pressure chemical vapor deposition (LPCVD), and/or plasma enhanced chemical vapor deposition (PECVD). As non-limiting examples, the semiconductor layer may have a thickness from about 30 nm to about 300 nm, from about 50 nm to about 200 nm, or from about 80 nm to about 150 nm.

In other exemplary embodiments, the gate metal layer 214 may comprise a metal layer including a conductive metallic material, which may be a metal, a metal alloy, or a metal nitride. For example, the metal layer may comprise a material such as TaN, TiN, WN, TiAlN, TaCN, other conductive refractory metal nitrides, and/or one or more alloys thereof. The conductive metallic material may be known as metal gate material in the art. As non-limiting examples, the thickness of the metal layer may be from about 5 nm to about 40 nm, or from about 7 nm to about 20 nm, although lesser and greater thicknesses are also contemplated herein. The metal layer may be formed, for example, by chemical vapor deposition (CVD), physical vapor deposition (PVD), or atomic layer deposition (ALD). In general, the gate metal layer 214 may comprise a semiconductor layer, a metal layer, a plurality of semiconductor layers, a plurality of metal layers, a stack of a semiconductor layer and a metal layer, or a combination thereof, as non-limiting examples.

Figure 5:
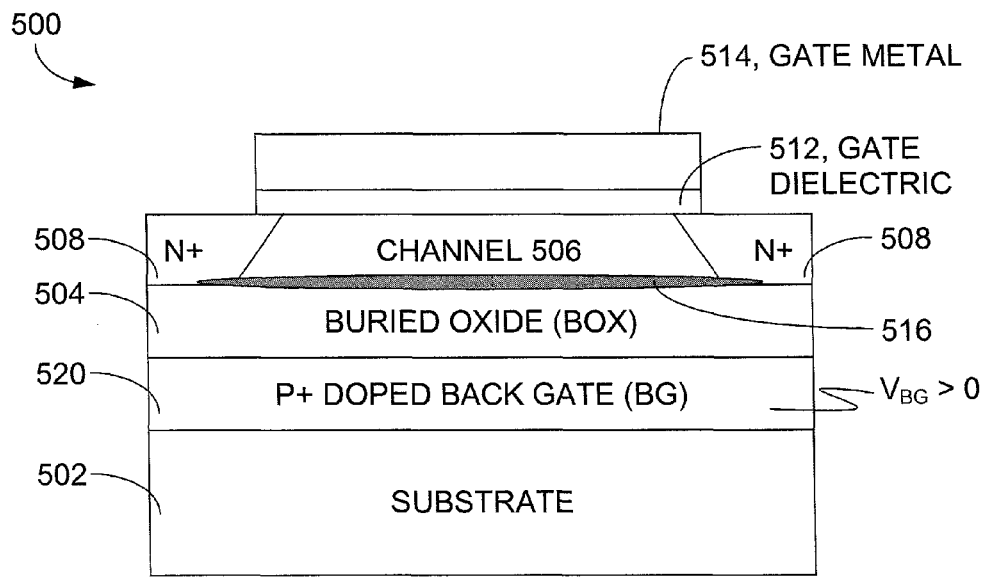
FIG. 5 shows one exemplary embodiment of the invention, namely an exemplary design for an inversion mode varactor with a P+ doped backgate.

FIG. 5 shows one exemplary embodiment of the invention, namely an exemplary design for an inversion mode varactor 500 (e.g., in a FDSOI) with a P+ doped backgate. The exemplary varactor 500 includes a substrate 502 with a P+ doped backgate (BG) 520 overlying the substrate 502 (e.g., the BG 520 may form part of the substrate 502, the substrate 502 may comprise the BG 520). A buried oxide (BOX) 504 overlies the BG 520. Overlying the BOX 504 is a channel 506 (e.g., undoped channel) with N+ doped regions 508 for the source/drain (S/D). Overlying the channel 506 are at least a gate dielectric 512 and a gate metal 514. Note that raised S/D structures (not shown) optionally may be used in order to lower parasitic resistance. Since the exemplary varactor 500 is a n-type varactor, a positive voltage ($V_{BG}>0$) is applied to the BG 520 to keep the semiconductor layer 506 close to the BOX layer 504 in inversion (e.g., to form an inversion region 516).

Figure 6:
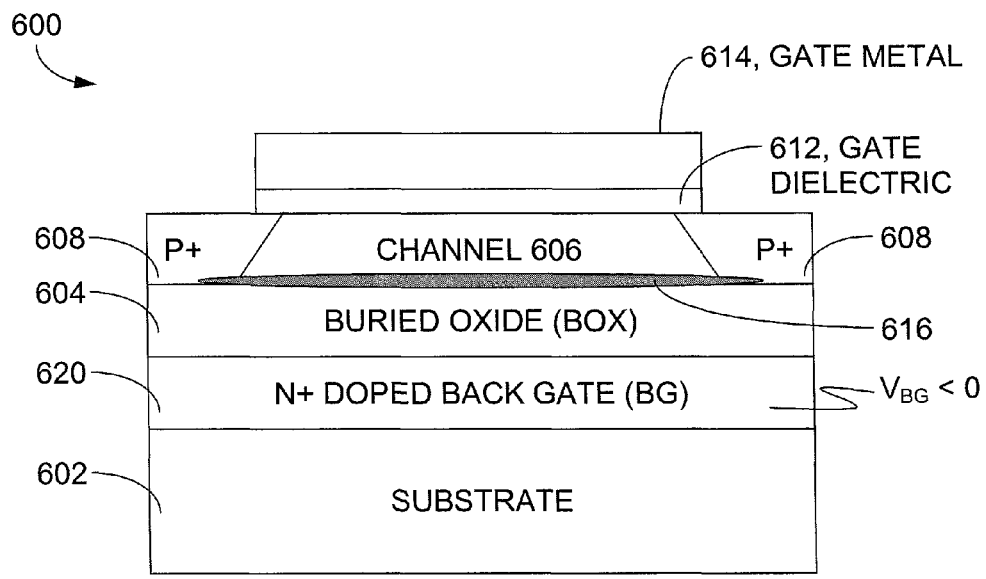
FIG. 6 shows another exemplary embodiment of the invention, namely an exemplary design for an inversion mode varactor with a N+ doped backgate.

FIG. 6 shows another exemplary embodiment of the invention, namely an exemplary design for an inversion mode varactor 600 (e.g., in a FDSOI) with a N+ doped backgate. The exemplary varactor 600 includes a substrate 602 with a N+ doped backgate (BG) 620 overlying the substrate 602 (e.g., the BG 620 may form part of the substrate 602, the substrate 602 may comprise the BG 620). A buried oxide (BOX) 604 overlies the BG 620. Overlying the BOX 604 is a channel 606 (e.g., undoped channel) with P+ doped regions 608 for the source/drain (S/D). Overlying the channel 606 are at least a gate dielectric 612 and a gate metal 614. Note that raised S/D structures (not shown) optionally may be used in order to lower parasitic resistance. Since the exemplary varactor 600 is a p-type varactor, a negative voltage ($V_{BG}<0$) is applied to the BG 620 to keep the semiconductor layer 606 close to the BOX layer 604 in inversion (e.g., to form an inversion region 616).

Figure 7:
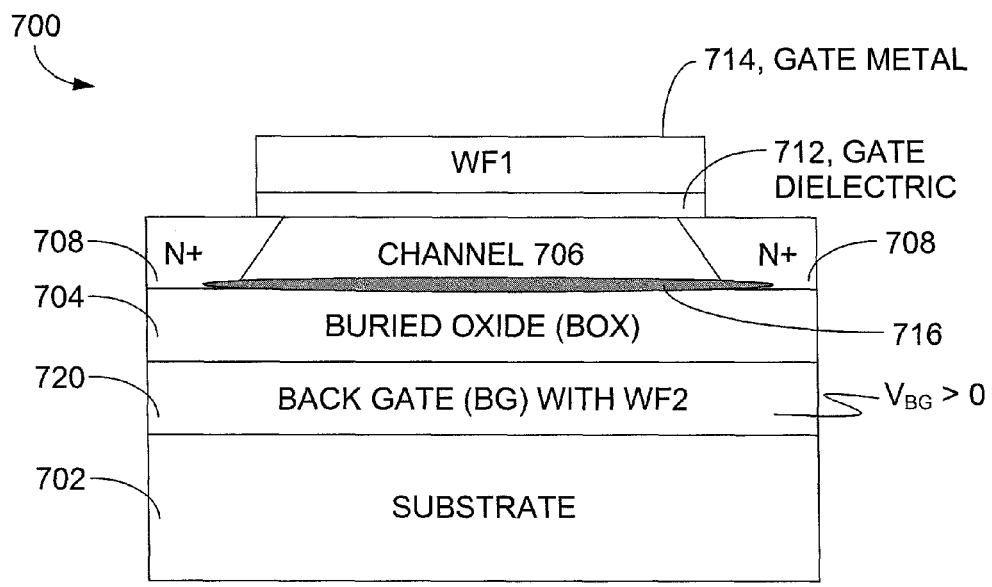
FIG. 7 shows a further exemplary embodiment of the invention, namely an exemplary design for an inversion mode varactor with a backgate having a different work function than the front gate.

FIG. 7 shows a further exemplary embodiment of the invention, namely an exemplary design for an inversion mode varactor 700 (e.g., in a FDSOI) with a backgate having a different work function than the front gate. The exemplary varactor 700 includes a substrate 702 with a backgate (BG) 720 overlying the substrate 702 (e.g., the BG 720 may form part of the substrate 702, the substrate 702 may comprise the BG 720). A buried oxide (BOX) 704 overlies the BG 720. Overlying the BOX 704 is a channel 706 (e.g., undoped channel) with N+ doped regions 708 for the source/drain (S/D). Overlying the channel 706 are at least a gate dielectric 712 and a gate metal 714. Note that raised S/D structures (not shown) optionally may be used in order to lower parasitic resistance. Since the exemplary varactor 700 is an n-type varactor, a positive voltage ($V_{BG}>0$) is applied to the BG 720 to keep the semiconductor layer 706 close to the BOX layer 704 in inversion (e.g., to form an inversion region 716). In the exemplary embodiment of FIG. 7, the BG 520 has a different work function (WF2) than the front gate (WF1, for the gate metal 714). The magnitude of the backgate bias will depend on the difference between the work functions (WF1 and WF2). In further exemplary embodiments, the BG 720 is P+ doped.

As non-limiting examples for an n-type varactor, WF1 may range from about 4 eV to about 4.5 eV (e.g., from about 4.2 eV to about 4.4 eV) and WF2 may range from about 4 eV to about 5.2 eV. For each device structure, the bias can be calculated so that the channel is inversion within the entire range that the gate voltage is varied. As a non-limiting example, for a gate voltage ranging from about 0 V to about 1 V, WF1=4.3 eV, WF2=4 eV and a BOX thickness of about 20 nm, the bias voltage is about 2 V. As a further non-limiting example, the SOI thickness may be about 15 nm for such an example. As a further example, with a SOI thickness of about 10 nm, the bias voltage may increase to about 3 V. Thus, as SOI thickness decreases (e.g., keeping other parameters about the same), a higher bias voltage may be needed (e.g., for an n-type varactor).

It should be appreciated that the above description and examples are equally applicable for a p-type varactor wherein a negative voltage is applied. As a non-limiting example, clearly the references to a "high enough" or "higher" (e.g., sufficiently high) bias voltage may be inverted to refer to a "low enough" or "lower" (e.g., sufficiently low) bias voltage.

Figure 8:
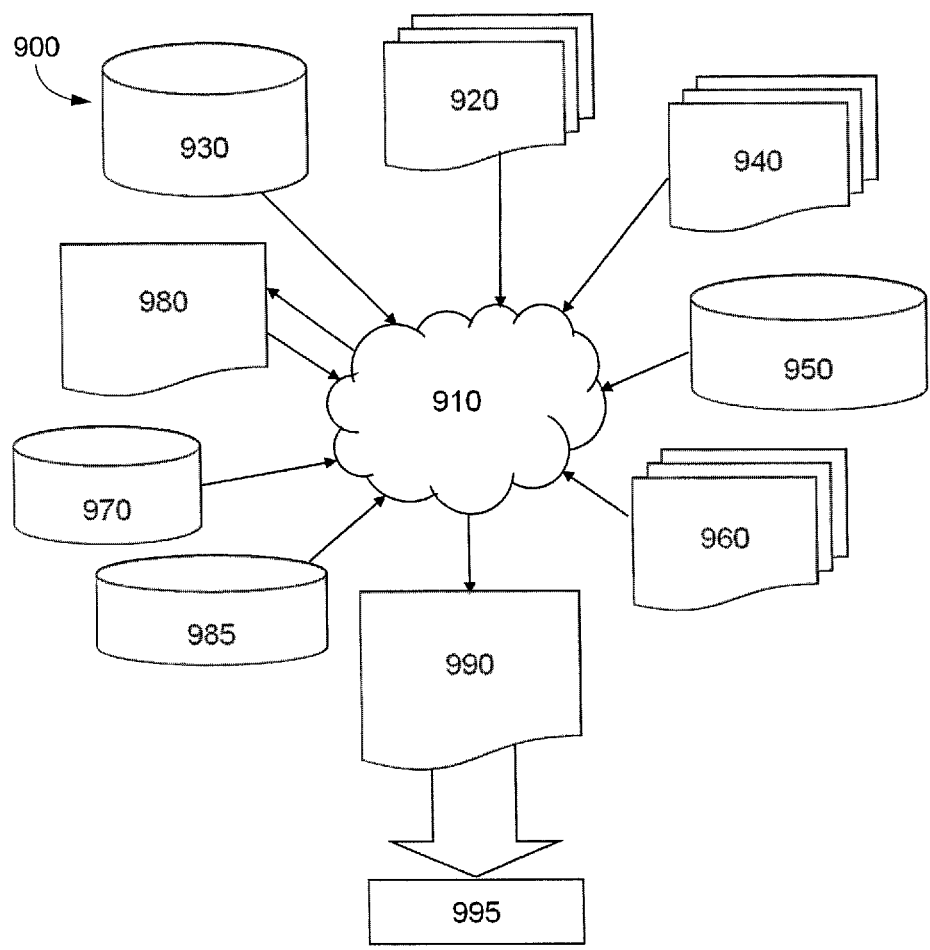
FIG. 8 is a flow diagram of an exemplary design process or design flow used in semiconductor integrated circuit design, manufacture, and/or test.

FIG. 8 shows a block diagram of an exemplary design flow 900 used, for example, in semiconductor integrated circuit (IC) logic design, simulation, test, layout, and manufacture. Design flow 900 includes processes and mechanisms for processing design structures or devices to generate logically or otherwise functionally equivalent representations of the design structures and/or devices described above and shown in FIGS. 2 and 5-7. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 8 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2 and 5-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2 and 5-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2 and 5-7. In one embodiment, design structure 990 may comprise a compiled, executable HDL simulation model that functionally simulates the devices shown in FIGS. 2 and 5-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2 and 5-7. Design structure 990 may then proceed to a stage 995 where, for example, design structure 990: proceeds to tape-out, is released to manufacturing, is released to a mask house, is sent to another design house, is sent back to the customer, etc.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

Figure 9:
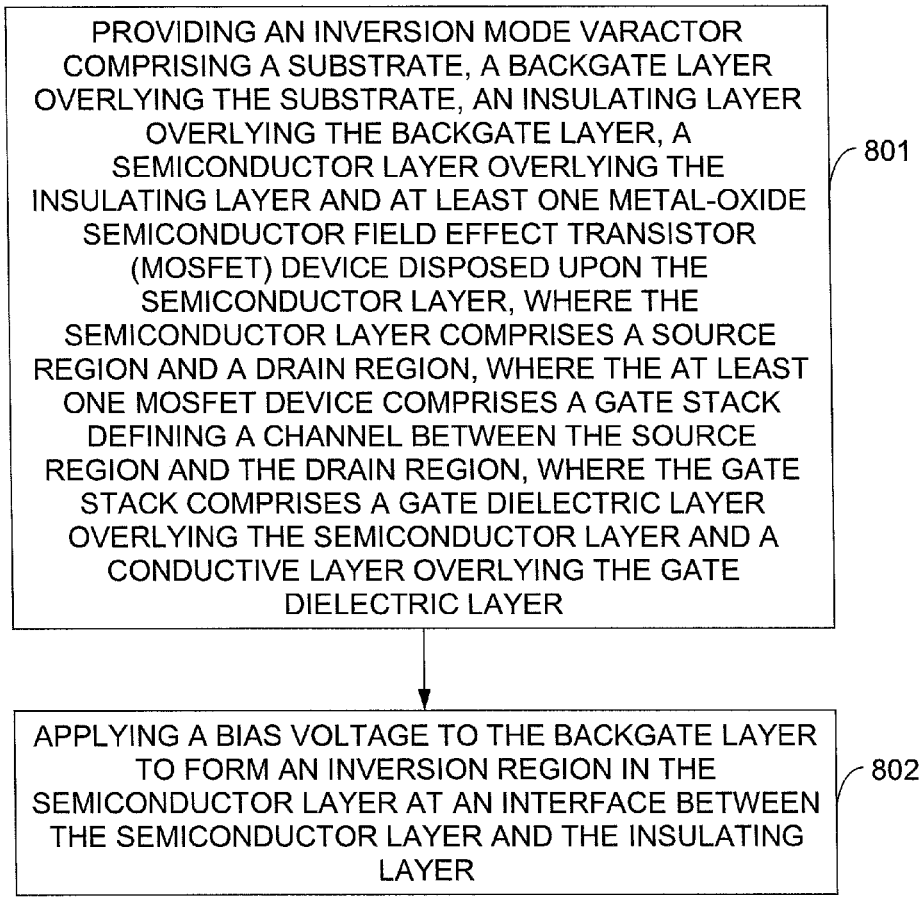
FIG. 9 depicts a flowchart illustrating one non-limiting example of a method for practicing the exemplary embodiments of this invention

(1) In one exemplary embodiment of the invention, and as shown in FIG. 9, a method comprising: providing an inversion mode varactor comprising a substrate, a backgate layer overlying the substrate, an insulating layer overlying the backgate layer, a semiconductor layer overlying the insulating layer and at least one metal-oxide semiconductor field effect transistor (MOSFET) device disposed upon the semiconductor layer, where the semiconductor layer comprises a source region and a drain region, where the at least one MOSFET device comprises a gate stack defining a channel between the source region and the drain region, where the gate stack comprises a gate dielectric layer overlying the semiconductor layer and a conductive layer overlying the gate dielectric layer (801); and applying a bias voltage to the backgate layer to form an inversion region in the semiconductor layer at an interface between the semiconductor layer and the insulating layer (802).

A method as above, where the formed inversion region lowers a series resistance of the inversion mode varactor. A method as in any above, where the formed inversion region increases a quality factor of the inversion mode varactor. A method as in any above, where the inversion mode varactor comprises an n-type varactor and the bias voltage comprises a positive voltage. A method as in any above, where the inversion mode varactor comprises a p-type varactor and the bias voltage comprises a negative voltage. A method as in any above, where the backgate layer has a different work function than the conductive layer.

A method as in any above, where the inversion mode varactor is formed in or on a fully-depleted silicon-on-insulator structure. A method as in any above, where the backgate layer comprises at least one of a metal, a doped semiconductor and a doped polycrystalline semiconductor. A method as in any above, where the bias voltage applied to the backgate is variable during operation of the inversion mode varactor. A method as in any above, where the insulating layer comprises a buried oxide layer. A method as in any above, where the MOSFET device at least partially overlies the source region and the drain region.

A method as in any above, further comprising one or more aspects of the exemplary embodiments of the invention as described herein.

(2) In another exemplary embodiment of the invention, an inversion mode varactor structure comprising: a substrate; a backgate layer overlying the substrate; an insulating layer overlying the backgate layer; a semiconductor layer overlying the insulating layer, where the semiconductor layer comprises a source region and a drain region; and at least one metal-oxide semiconductor field effect transistor (MOSFET) device disposed upon the semiconductor layer, where the at least one MOSFET device comprises a gate stack defining a channel between the source region and the drain region, where the gate stack comprises a gate dielectric layer overlying the semiconductor layer and a conductive layer overlying the gate dielectric layer, where a bias voltage is applied to the backgate layer via a contact, where the applied bias voltage forms an inversion region in the semiconductor layer at an interface between the semiconductor layer and the insulating layer.

An inversion mode varactor structure as above, where the formed inversion region lowers a series resistance of the inversion mode varactor. An inversion mode varactor structure as in any above, where the formed inversion region increases a quality factor of the inversion mode varactor. An inversion mode varactor structure as in any above, where the inversion mode varactor comprises an n-type varactor and the bias voltage comprises a positive voltage. An inversion mode varactor structure as in any above, where the inversion mode varactor comprises a p-type varactor and the bias voltage comprises a negative voltage.

An inversion mode varactor structure as in any above, further comprising one or more aspects of the exemplary embodiments of the invention as described herein.

(3) In a further exemplary embodiment of the invention, an inversion mode varactor structure comprising: a substrate; a backgate layer overlying the substrate; an insulating layer overlying the backgate layer; a semiconductor layer overlying the insulating layer, where the semiconductor layer comprises a source region and a drain region; and at least one metal-oxide semiconductor field effect transistor (MOSFET) device disposed upon the semiconductor layer, where the at least one MOSFET device comprises a gate stack defining a channel between the source region and the drain region, where the gate stack comprises a gate dielectric layer overlying the semiconductor layer and a conductive layer overlying the gate dielectric layer, where the backgate layer is doped such that an inversion region is formed in the semiconductor layer at an interface between the semiconductor layer and the insulating layer.

An inversion mode varactor structure as in any above, where the formed inversion region lowers a series resistance of the inversion mode varactor. An inversion mode varactor structure as in any above, where the formed inversion region increases a quality factor of the inversion mode varactor. An inversion mode varactor structure as in any above, where the backgate layer has a different work function than the conductive layer. An inversion mode varactor structure as in any above, where the inversion mode varactor is formed in or on a fully-depleted silicon-on-insulator structure.

An inversion mode varactor structure as in any above, further comprising one or more aspects of the exemplary embodiments of the invention as described herein.

The blocks shown in FIG. 9 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIG. 9 should be considered merely exemplary and non-limiting. It should be appreciated that the blocks shown in FIG. 9 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIG. 9 so as to implement one or more further exemplary embodiments of the invention.

That is, the exemplary embodiments of the invention shown in FIG. 9 may be utilized, implemented or practiced in conjunction with one or more further aspects in any combination (e.g., any combination that is suitable, practicable and/or feasible) and are not limited only to the steps, blocks, operations and/or functions shown in FIG. 9.

While referred to herein in many places as a buried oxide or BOX, it should be understood that this layer or element generally may be referred to as an insulating layer or a buried insulator layer. One of ordinary skill in the art will appreciate the various materials and structure that are suitable for use as, in or with such an insulating layer. As non-limiting examples, the insulating layer may comprise an oxide, a nitride and/or a dielectric material such as silicon oxide, silicon nitride, silicon oxynitride and/or sapphire.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. An inversion mode varactor structure comprising:
a substrate;
a backgate layer overlying the substrate;
an insulating layer overlying the backgate layer;
a semiconductor layer overlying the insulating layer, where the semiconductor layer comprises a source region and a drain region; and
at least one metal-oxide semiconductor field effect transistor (MOSFET) device disposed upon the semiconductor layer, where the at least one MOSFET device comprises a gate stack defining a channel between the source region and the drain region, where the gate stack comprises a gate dielectric layer overlying the semiconductor layer and a conductive layer overlying the gate dielectric layer,
where the backgate layer is doped such that an inversion region is formed in the semiconductor layer at an interface between the semiconductor layer and the insulating layer.

2. The inversion mode varactor of claim 1, where the formed inversion region lowers a series resistance of the inversion mode varactor.

3. The inversion mode varactor of claim 1, where the formed inversion region increases a quality factor of the inversion mode varactor.

4. The inversion mode varactor of claim 1, where the backgate layer has a different work function than the conductive layer.

5. The inversion mode varactor of claim 1, where the inversion mode varactor is formed in or on a fully-depleted silicon-on-insulator structure.

6. The inversion mode varactor of claim 1, where the inversion mode varactor comprises an n-type varactor and a bias voltage comprises a positive voltage.

7. The inversion mode varactor of claim 1, where the inversion mode varactor comprises a p-type varactor and a bias voltage comprises a negative voltage.

8. The inversion mode varactor of claim 1, where the backgate layer comprises at least one of a metal, a doped semiconductor and a doped polycrystalline semiconductor.

9. The inversion mode varactor of claim 1, where the insulating layer comprises a buried oxide layer.

10. The inversion mode varactor of claim 1, where a doping concentration of the backgate layer is more than about $1e^{18}$ $cm^{-3}$.

11. The inversion mode varactor of claim 1, where a doping concentration of the backgate layer is more than about $1e^{19}$ $cm^{-3}$.

12. The inversion mode varactor of claim 1, further comprising: raised source/drain structures overlying the source region and the drain region.

13. The inversion mode varactor of claim 1, where the backgate layer has a thickness in a range of about 20 nanometers to about 200 nanometers.

14. The inversion mode varactor of claim 1, where the insulating layer has a thickness in a range of about 5 nanometer to about 50 nanometers.

15. The inversion mode varactor of claim 14, where the inversion mode varactor comprises an n-type varactor and a bias voltage is greater than 1 volt.

16. The inversion mode varactor of claim 1, where the insulating layer comprises at least one of silicon oxide, silicon nitride, silicon oxynitride and sapphire.

17. The inversion mode varactor of claim 1, where the inversion mode varactor is embodied in an amplifier, an oscillator, a frequency synthesizer, a voltage-controlled oscillator, a frequency multiplier, a harmonic generator, a modulation component or a demodulation component.

* * * * *